United States Patent
Wu et al.

(10) Patent No.: US 9,535,281 B2
(45) Date of Patent: Jan. 3, 2017

(54) DISPLAY PANEL COMPRISING FIRST AND SECOND MAGENETIC LAYERS, DISPLAY DEVICE COMPRISING THE SAME, AND METHOD FOR FABRICATING THE DISPLAY PANEL

(71) Applicants: BOE Technology Group Co., Ltd., Beijing (CN); Beijing BOE Display Technology Co., Ltd., Beijing (CN)

(72) Inventors: Jun Wu, Beijing (CN); Hongming Zhan, Beijing (CN); Chao Tian, Beijing (CN)

(73) Assignees: Boe Technology Group Co., Ltd., Beijing (CN); Beijing Boe Display Technologies Co., Ltd., Beijing (CN)

( * ) Notice: Subject to any disclaimer, the term of this patent is extended or adjusted under 35 U.S.C. 154(b) by 5 days.

(21) Appl. No.: 14/500,620

(22) Filed: Sep. 29, 2014

(65) Prior Publication Data

US 2015/0346544 A1 Dec. 3, 2015

(30) Foreign Application Priority Data

May 30, 2014 (CN) .......................... 2014 1 0240894

(51) Int. Cl.
  *G02F 1/1333* (2006.01)
  *H05K 1/14* (2006.01)
  (Continued)

(52) U.S. Cl.
  CPC ....... *G02F 1/133512* (2013.01); *H05K 1/0274* (2013.01); *H05K 1/14* (2013.01);
  (Continued)

(58) Field of Classification Search
  CPC .................... H05K 1/14; H05K 5/0017; G02F 2001/133354; G02F 1/0081
  See application file for complete search history.

(56) References Cited

U.S. PATENT DOCUMENTS

| 2008/0105550 | A1* | 5/2008 | Misawa | .................... B44F 1/10 |
| | | | | 204/600 |
| 2009/0079929 | A1* | 3/2009 | Chao | ..................... G02F 1/1337 |
| | | | | 349/191 |
| 2010/0079718 | A1* | 4/2010 | Sekiya | .............. G02F 1/133512 |
| | | | | 349/153 |

FOREIGN PATENT DOCUMENTS

CN 202486472 10/2012
CN 103293777 9/2013
(Continued)

OTHER PUBLICATIONS

Office action from Chinese Application No. 201410240894.1 dated Mar. 2, 2016.

*Primary Examiner* — Paul Lee

(74) *Attorney, Agent, or Firm* — Calfee, Halter & Griswold LLP

(57) ABSTRACT

The general inventive concepts relate to display technology, and provides a display panel, a display device, and a method for fabricating a display panel. It reduces ripples in the display panel and light leakage around the pixel region from occurring when the display panel is subject to a pressure. The display panel comprises a first and second substrate which are arranged oppositely. The first substrate comprises a black matrix layer and a first magnetic layer. The second substrate comprises a second magnetic layer which corresponds to the first magnetic layer in position. The first and second magnetic layers form an attractive magnetic field force between the first and second substrates.

14 Claims, 3 Drawing Sheets

(51) Int. Cl.
  *G02F 1/1335* (2006.01)
  *H05K 1/02* (2006.01)
  *H05K 5/00* (2006.01)
  *G02F 1/00* (2006.01)

(52) U.S. Cl.
  CPC ......... *H05K 5/0017* (2013.01); *G02F 1/0081* (2013.01); *G02F 2001/133354* (2013.01)

(56) References Cited

FOREIGN PATENT DOCUMENTS

| | | |
|---|---|---|
| CN | 103792722 | 5/2014 |
| JP | H0926580 | 1/1997 |

\* cited by examiner

DISPLAY PANEL COMPRISING FIRST AND SECOND MAGENETIC LAYERS, DISPLAY DEVICE COMPRISING THE SAME, AND METHOD FOR FABRICATING THE DISPLAY PANEL

RELATED APPLICATIONS

The present application claims the benefit of Chinese Patent Application No. 201410240894.1, filed May 30, 2014, the entire disclosure of which is incorporated herein by reference.

FIELD

The present disclosure relates to the field of display technology, and particularly to a display panel, a display device, and a method for fabricating a display panel.

BACKGROUND

Conventional display panels generally comprise a color film substrate and an array substrate which are arranged oppositely, and a liquid crystal layer between the color film substrate and the array substrate. The color film substrate comprises a black matrix layer and a second alignment layer over the black matrix layer which covers the color film substrate. The array substrate comprises a plurality of pixel units which are arranged in a matrix, thin film transistors which correspond to each pixel unit, and a first alignment layer which covers the array substrate.

As shown in FIG. 1, it has been found that when a display panel is subject to a pressure, a relative displacement d develops between a color film substrate 10' and an array substrate 20' in a direction parallel with the display panel. At the same time, at the position of the display panel where it is subject to the pressure, the distance between the array substrate and the color film substrate also changes. The relative displacement between the color film substrate and the array substrate will cause the liquid crystal to flow locally, thus leading to ripples. In addition, the relative displacement d between the color film substrate 10' and the array substrate 20' in the direction parallel with the display panel tends to cause a black matrix layer 101' to offset in position, thus leading to light leakage around the pixel unit. When the display panel is a twisted nematic (TN) model display panel, the rubbing trace is relatively shallow. As a result, in regions of the alignment layer in the color film substrate 10' near metal lines (i.e., around the pixel unit), the effect on the direction of the liquid crystal molecules 30' is relatively small.

SUMMARY

The general inventive concepts provide a display panel, a display device, and a method for fabricating a display panel, which can avoid or at least alleviate one or more of the problems in the prior art.

To this end, the present disclosure provides a display panel comprising a first substrate and a second substrate arranged oppositely, wherein the first substrate comprises a black matrix layer and a first magnetic layer. The second substrate comprises a second magnetic layer which corresponds to the first magnetic layer in position. The first and second magnetic layers form an attractive magnetic field force between the first substrate and the second substrate.

In the present disclosure, the first and second magnetic layers form an attractive magnetic field force between the first and second substrates. When the display panel is subject to a pressure, the magnetic field force can effectively prevent the array substrate and the color film substrate from displacing with respect to each other. Thereby, the relative position of the first and second substrates of the display panel are fixed, i.e., the position of the black matrix layer is fixed. This can effectively prevent ripples in the display panel and light leakage around the pixel region, thus greatly improving the display quality.

The first and second magnetic layers can have opposite polarities on their confronting surfaces.

The first magnetic layer can have N polarity on the surface facing the second magnetic layer, and the second magnetic layer can have S polarity on the surface facing the first magnetic layer.

The first magnetic layer can be a top layer of the first substrate at a side facing the second substrate, and the second magnetic layer can be a top layer of the second substrate at a side facing the first substrate.

In certain embodiments, the first and second magnetic layers have opposite polarities on their confronting surfaces. When the first and second magnetic layers are top layers of the first and second substrates respectively, the distance between the first and second magnetic layers is relatively small, and a magnetic field of relatively high intensity is formed between the first and second magnetic layers. This magnetic field of relatively high intensity further can effectively prevent ripples in the display panel and light leakage around the pixel region from occurring in the display panel under a pressure, thus greatly improving the display quality.

The first magnetic layer can be a top layer of the first substrate on a surface facing away from the second substrate, and the second magnetic layer can be a top layer of the second substrate on a surface facing the first substrate.

The first and second magnetic layers can be comprised of the same material.

The display panel can be a touch display panel.

In a direction perpendicular to the display panel, the first and second magnetic layers are arranged to correspond in position to the black matrix layer, thereby avoiding adverse effects on the light transmittance of the display panel.

The present disclosure further provides a display device comprising any one of the above-mentioned display panels. Since the above-mentioned display panel has technical effects as described above, the display device comprising the display panel also has the corresponding technical effects.

The present disclosure further provides a method for fabricating a display panel, comprising steps of: forming a black matrix layer and a first magnetic layer on a first substrate; forming a second magnetic layer on a second substrate, the second magnetic layer corresponding in position to the first magnetic layer, wherein the first and second magnetic layers form an attractive magnetic field force between the first and second substrates; and arranging the first and second substrates oppositely.

The method can comprise forming the first and second magnetic layers so that they have opposite polarities on their confronting surfaces.

In certain embodiments, the step of forming the first magnetic layer can comprise forming the first magnetic layer to have N polarity on the surface facing the second magnetic layer, and the step of forming the second magnetic layer comprises forming the second magnetic layer to have S polarity on the surface facing the first magnetic layer.

In certain embodiments, the step of forming the first magnetic layer can comprise forming the first magnetic layer as a top layer of the first substrate on a surface facing the second substrate, and the step of forming the second magnetic layer can comprise forming the second magnetic layer as a top layer of the second substrate on a surface facing the first substrate.

In certain embodiments, the step of forming the first magnetic layer can comprise forming the first magnetic layer as a top layer of the first substrate on a surface facing away from the second substrate, and the step of forming the second magnetic layer can comprise forming the second magnetic layer as a top layer of the second substrate on a surface facing the first substrate.

In the method, the step of forming the black matrix layer and the first magnetic layer can comprise forming the black matrix layer and the first magnetic layer, so that in a direction perpendicular to the display panel, the first magnetic layer corresponds to the black matrix layer in position.

In the display panel fabricated by the above method, when the display panel is subject to a pressure, it is possible to effectively prevent ripples in the display panel and light leakage around the pixel region, thus greatly improving the display quality.

BRIEF DESCRIPTION OF THE DRAWINGS

Several technical aspects of the present disclosure will be described in more detail below with reference to the accompanying drawings in order for those skilled in the art to be able to carry out the present disclosure. The present disclosure may, however, be embodied in many different forms and should not be construed as limited to the exemplary embodiments set forth herein. In particular, the general inventive concepts are not intended to be limited by the various illustrative embodiments disclosed herein.

DETAILED DESCRIPTION

Figure 1:
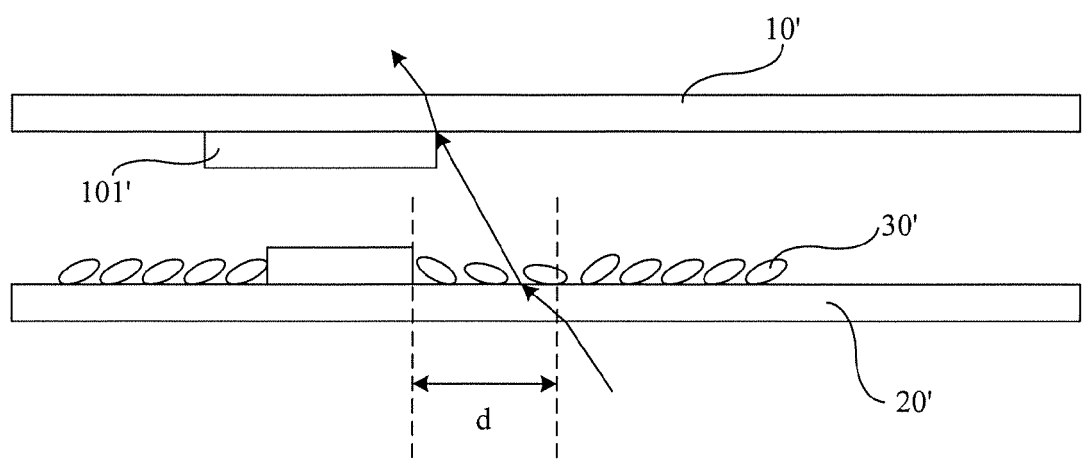
FIG. 1 is a cross-sectional view illustrating a display panel in the prior art.

The present invention and associated general inventive concepts will be further described hereinafter in detail with reference to the accompanying drawings and various exemplary embodiments. One of ordinary skill in the art will appreciate that these exemplary embodiments only constitute a fraction of the possible embodiments encompassed by the present invention and associated general inventive concepts. As such, the scope of the present disclosure is by no means limited to the exemplary embodiments set forth herein.

The present disclosure provides a display panel, a display device, and a method for fabricating a display panel, which can effectively prevent ripples in the display panel and light leakage around the pixel region from occurring in the display panel under a pressure. In certain embodiments, the first substrate comprises a black matrix layer and a first magnetic layer, the second substrate comprises a second magnetic layer which corresponds to the first magnetic layer in position, and the first and second magnetic layers form an attractive magnetic field force between the first and second substrates. The magnetic field force can effectively prevent relative displacement between two substrates of the display panel under a pressure, and can effectively prevent ripples in the display panel and light leakage around the pixel region. Thereby, the display quality may be improved. In the context of the present disclosure, when reference is made to the first and second magnetic layers, the expression "layer" and "film" can be used interchangeably.

Reference numerals in the drawings are explained as follow: 10'—color film substrate, 101'—black matrix layer, 20'—array substrate, 30'—liquid crystal molecule, d-relative displacement, 10—first substrate, 101—black matrix layer, 102—first magnetic layer, 103—spacer, 20—second substrate, 201—thin film transistor, and 202—second magnetic layer.

Figure 2:
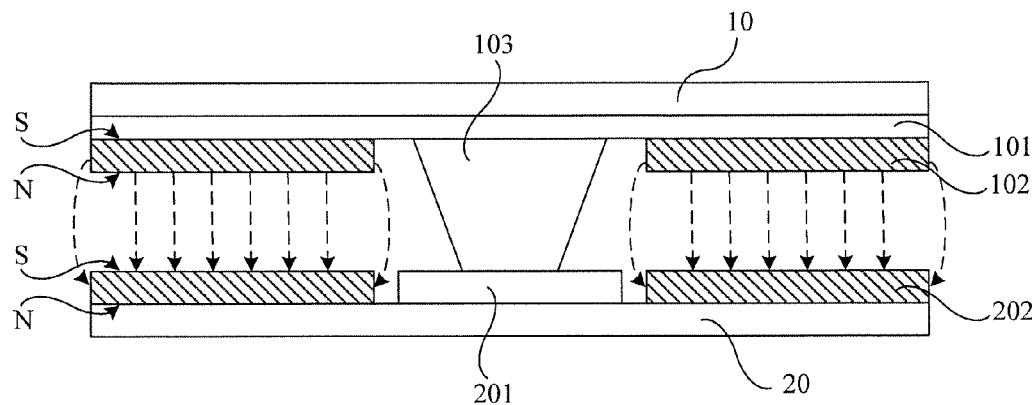
FIG. 2 is a schematic structural diagram illustrating a display panel of the present disclosure.
Figure 3:
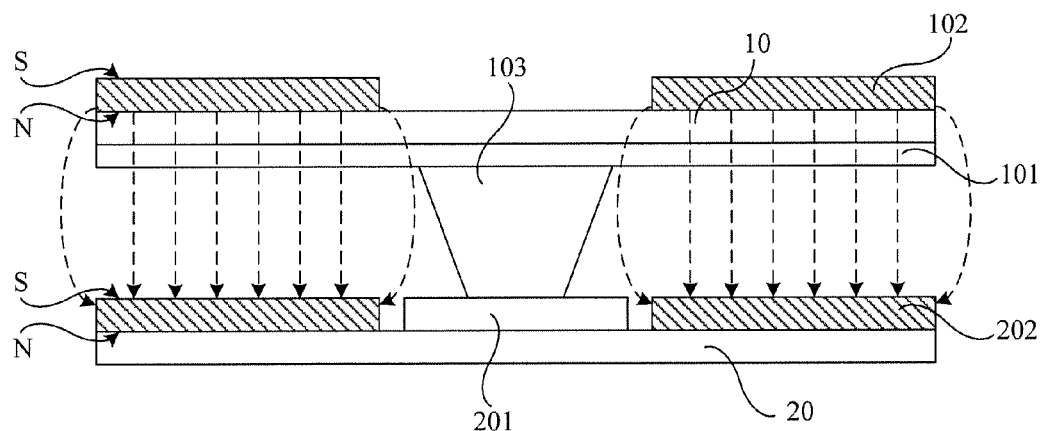
FIG. 3 is another schematic structural diagram illustrating a display panel of the present disclosure.

As shown in FIGS. 2 and 3, in a first embodiment, there is provided a display panel comprising a first substrate 10 and a second substrate 20 which are arranged oppositely. The first substrate 10 comprises a black matrix layer 101 and a first magnetic layer 102. The second substrate 20 comprises a second magnetic layer 202 which corresponds in position to the first magnetic layer 102. The first magnetic layer 102 and the second magnetic layer 202 form an attractive magnetic field force between the first substrate 10 and the second substrate 20.

In certain embodiments, the first substrate can be a color film substrate, and the second substrate can be an array substrate. However, the present disclosure is not limited to this particular arrangement.

Referring to FIG. 2, an exemplary display panel will be described while taking an example in which the first substrate 10 is a color film substrate and the second substrate 20 is an array substrate.

The display panel comprises an array substrate 20 and a color film substrate 10 which are arranged oppositely, a liquid crystal layer which is filled between the array substrate 20 and the color film substrate 10, and a spacer 103 which is formed on the color film substrate 10. The color film substrate 10 comprises a black matrix layer 101 and a first magnetic layer 102. The array substrate 20 comprises a second magnetic layer 202 which corresponds to the first magnetic layer 102 in position. The first magnetic layer 102 and the second magnetic layer 202 may have opposite polarities on their confronting surfaces. In a direction perpendicular to the display panel, the first magnetic layer 102 can correspond to the black matrix layer 101 in position. The first magnetic layer 102 corresponds to the second magnetic layer 202 in position, and the first magnetic layer 102 and the second magnetic layer 202 correspond to the black matrix layer 101 in position, thereby minimizing adverse effect on the light transmittance of the display panel.

The first magnetic layer 102 and the second magnetic layer 202 form an attractive magnetic field force between the first substrate 10 and the second substrate 20, so that upon being arranged oppositely, the first and second substrates can maintain a stable position relative to one another. When the display panel is subjected to a pressure, the relative movement between the array substrate 20 and the color film substrate 10 can be effectively avoided, and a local flow of liquid crystal is avoided. In addition, relative displacement between the array substrate 20 and the color film substrate 10 in a direction parallel with the display panel can be effectively prevented, so that the array substrate and the color film substrate maintain a stable position relative to one another. Namely, the black matrix layer 101 maintains a stable position. This can effectively prevent light leakage around the pixel region, thus greatly improving the display quality. In a region of an alignment layer in the display panel where the rubbing trace is relatively shallow, this effect can be particularly beneficial.

For example in the case wherein the display panel is a touch display panel, when the display panel is touched, two substrates of the display panel can maintain a stable position relative to one another, thus effectively preventing ripples in the display panel and light leakage around the pixel region.

It is noted that the present display panel can be, but not limited to, a TN mode display panel and a FFS (Fringe Field Switching) mode display panel.

In the prior art, when the display panel is under a pressure, relative displacement between the array substrate and the color film substrate in a direction parallel with the plane of the display panel tends to introduce misalignment of the spacer. Thereby, the necessary allowable cell gap of the display panel will not be maintained. In the present display panel, two substrates have a stable relative position when subjected to pressure. This can effectively prevent misalignment between the spacer 103 and a supporting point on the thin film transistor 201, thus ensuring the function of spacer 103 for maintaining the cell gap between the array substrate and the color film substrate. This reduces local flow of liquid crystal in the display panel under a pressure, thus preventing ripples in the display panel and improving display quality.

The material of the first and second magnetic layers can comprise a metal magnetic thin film and a metal oxide magnetic thin film. The metal magnetic thin film can comprise Fe, Co, or Fe—Ni. The metal oxide magnetic thin film can comprise spinel, magneto-plumbite, or garnet type ferrite. The relatively stable magnetic property of the metal oxide magnetic thin film make it an acceptable choice herein. In this manner, it is not only possible to reduce ripples in the display panel and light leakage around the pixel region in the display panel when subjected to a pressure, but also to mitigate the effect on the deflection of liquid crystal.

As shown in FIG. 2, the first magnetic layer 102 can be a top layer of the first substrate 10 on a surface facing the second substrate 20, i.e., one of the layers on the first substrate 10 which is closest to the second substrate 20. The second magnetic layer 202 can be a top layer of the second substrate 20 on a surface facing the first substrate 10, i.e., one of the layers on the second substrate 20 which is closes to the first substrate 10. The first magnetic layer 102 and the second magnetic layer 202 can have opposite polarities on their confronting surfaces. For example, as shown in the left side of FIG. 2, the first magnetic layer 102 can have N polarity on the surface facing the second magnetic layer 202, and the second magnetic layer 202 can have S polarity on the surface facing the first magnetic layer 102. However, the present disclosure is not limited to the case shown in FIG. 2. For example, the first magnetic layer 102 can have S polarity on the surface facing the second magnetic layer 202, and the second magnetic layer 202 can have N polarity on the surface facing the first magnetic layer 102.

As described above, the first and second magnetic layers have opposite polarities on their confronting surfaces, and the first and second magnetic layers are top layers of the first and second substrates, respectively. In other words, the distance between the first and second magnetic layers is relatively small, so that a magnetic field of relatively high intensity is formed between the first and second magnetic layers. This magnetic field of relatively high intensity can reduce the relative displacement between the array substrate and the color film substrate in a direction parallel with the display panel in the display panel when subjected to pressure, thus preventing ripples in the display panel and light leakage around the pixel region.

The first and second magnetic layers can be fabricated by various methods. In certain embodiments, by forming the first magnetic layer on the first substrate as an example, the first magnetic layer can be formed by a vacuum evaporation process. In the vacuum evaporation process, a magnetic material is evaporated onto the first substrate by heating in a vacuum chamber to effect deposition, thus forming the first magnetic layer.

The first magnetic layer can also be formed by an electroplating process. In the electroplating process, the magnetic material and the first substrate are used to act as an anode and a cathode respectively in an electrolyte, and the first magnetic layer is deposited onto the first substrate to form the first magnetic layer.

The first magnetic layer can also be formed by a sputtering process. In the sputtering process, an inert gas filled in a vacuum chamber is ionized, and these ions bombard a target of the magnetic material at a high speed, so that atoms of the magnetic material are sputtered and attached onto the first substrate to form the first magnetic layer.

Alternatively, the first magnetic layer can also be formed by an epitaxial growth process or an electroless plating process. The second magnetic layer may be formed on the second substrate in a similar fashion.

As shown in FIG. 3, in the present display panel, the first magnetic layer 102 can also be a top layer of the first substrate 10 on a surface facing away from the second substrate 20, i.e., one of the layers on the second substrate 20 which is furthest from the first substrate 10. The second magnetic layer 202 can also be a top layer of the second substrate 20 on a surface facing the first substrate 10, i.e., one of the layers on the second substrate 20 which is closes to the first substrate 10. Also, the first magnetic layer 102 and the second magnetic layer 202 have opposite polarities on their confronting surfaces.

Reference is made to an example in which the first magnetic layer 102 and the second magnetic layer 202 have N polarity and S polarity respectively, on their confronting surfaces. When the first substrate 10 and the second substrate 20 are arranged oppositely to form the display panel, the first magnetic layer 102 has N polarity on the surface facing the second magnetic layer 202, and the second magnetic layer 202 has S polarity on the surface facing the first magnetic layer 102. Thus, the first magnetic layer 102 and the second magnetic layer 202 form an attractive magnetic field force between the first substrate 10 and the second substrate 20. The attractive magnetic field force can effectively prevent the relative displacement between the array substrate and the color film substrate when the display panel is subject to a pressure, this reduces any local flow of the liquid crystal, and reduces ripples. In addition, the attractive magnetic field force can reduce the relative displacement between the array substrate and the color film substrate in a direction parallel with the display panel, and prevent light leakage around the pixel region.

In certain embodiments, the first and second magnetic layers can be comprised of similar or identical materials. When the first and second magnetic layers are made from the same material, they can be formed by the same kind of process, so that the fabricating procedure is effectively simplified, and the production cost is reduced.

For example, when the first magnetic layer 102 and the second magnetic layer 202 are FeTe alloy thin films, they can be formed in the following manner. High purity powders of Fe and Te are sintered into a target of FeTe alloy at a temperature of 700° C. The target of FeTe alloy is bombarded by laser at 500° C. in a high vacuum chamber, so that micro-sized alloy particles are sputtered from the target of FeTe alloy and attached onto the substrate. Alternatively, the first and second magnetic layers may be formed by an annealing process at 300° C. in an atmosphere of high purity Ar.

When the first magnetic layer 102 and the second magnetic layer 202 are co-doped ZnO thin films, they can be formed in the following manner. High purity powders of ZnO and $Co_3O_4$ are sintered onto a target at high temperature. The target is bombarded by laser at a high temperature of 750° C. in an atmosphere of pure oxygen. The sputtered ZnCoO is deposited onto the substrate to form the respective magnetic layer.

The second magnetic layer 202 is a top layer of the second substrate 20 on a surface facing the first substrate 10. Likewise, the first magnetic layer 102 is a top layer of the first substrate 10 on a surface facing the second substrate 20 (FIG. 2) or a top layer of the first substrate 10 on a surface facing away from the second substrate 20 (FIG. 3). However, the present disclosure is not limited to this.

For example, the first magnetic layer 102 can be a layer which is most away from the second substrate 20, a layer which is closest to the second substrate 20, or any intermediate layer among the stack comprised in the first substrate 10, and the second magnetic layer 202 can also be a layer which is furthest from the first substrate 10, a layer which is closest to the first substrate 10, or any intermediate layer among the stack comprised in the second substrate 20.

Based on the display panel in the above disclosure, the present disclosure further provides a display device, which comprises the display panel as disclosed above.

In embodiments according to the general inventive concepts, when the display panel is subject to a pressure, a relative displacement between two substrates in a direction parallel with the display panel tends not to occur, so that the black matrix layer is fixed in position. Thus, this can reduce ripples in the display panel and reduce light leakage around the pixel region.

The display device can be any product or component with a display function like a mobile phone, tablet computer, TV, monitor, notebook computer, digital photo frame, and navigator. Embodiments for the display device will not be repeated herein for the sake of simplicity.

Figure 4:
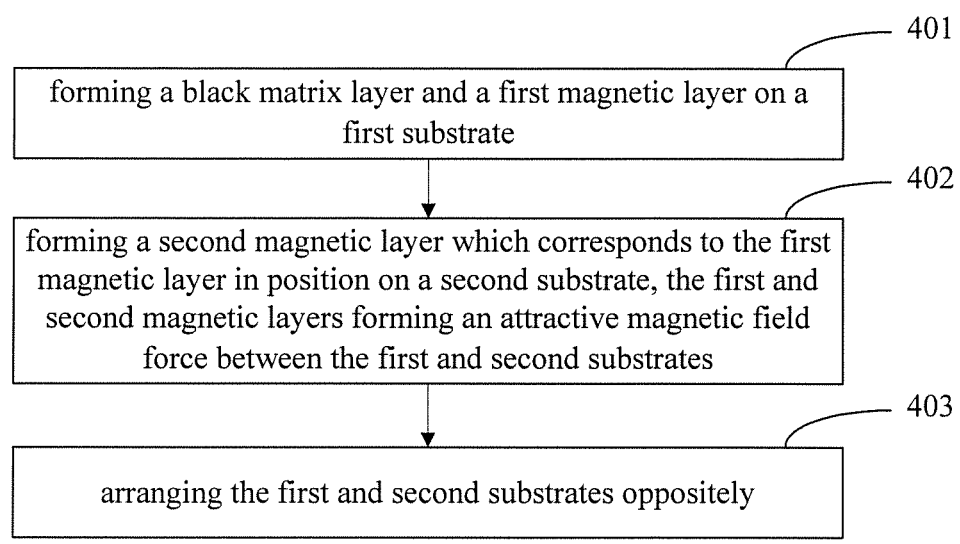
FIG. 4 is a flow chart illustrating the method for fabricating a display panel of the present disclosure.

The present disclosure further provides a method for fabricating a display panel. FIG. 4 is a schematic flow chart illustrating a method for fabricating a display panel of an embodiment. The method comprises steps of:

step 401: forming a black matrix layer and a first magnetic layer on a first substrate;

step 402: forming a second magnetic layer which corresponds in position to the first magnetic layer on a second substrate, wherein the first and second magnetic layers form an attractive magnetic field force between the first and second substrates; and step 403: arranging the first substrate from step 401 and the second substrate from step 402 oppositely.

It is noted that step 401 can be followed by step 402, step 402 can be followed by step 401, or steps 401, 402 can be performed simultaneously.

A method for fabricating a display panel will be described hereinafter, and the present disclosure is not limited to this method. This method can comprise steps of:

first step: forming a black matrix layer on a plate of a first substrate;

second step: forming a first magnetic layer which corresponds in position to the black matrix layer on the first substrate from the first step;

third step: forming spacers on the first substrate from the second step;

fourth step: forming a plurality of pixel units on a second substrate, wherein the pixel units are arranged in an array, and thin film transistors which correspond to each of the pixel units;

fifth step: forming a second magnetic layer which corresponds in position to the first magnetic layer on the second substrate from the second step, wherein the first and second magnetic layers form an attractive magnetic field force between the first and second substrates; and sixth step: filling a liquid crystal layer on the first or second substrate from the third or fifth step, and arranging the first and second substrates oppositely with a sealing agent.

In the display panel fabricated by the above method, when the display panel is subjected to a pressure, the first and second magnetic layers form an attractive magnetic field force between the first and second substrates. When the display panel is subject to a pressure, the attractive magnetic field force reduces a relative displacement between two substrates in a direction parallel with the display panel. Namely, the black matrix layer has a stable position. This can effectively prevent ripples in the display panel and light leakage around the pixel region, thus greatly improving the display quality.

Although the present disclosure has been described above with reference to specific embodiments, it should be understood that the limitations of the described embodiments are merely for illustrative purpose and by no means limiting. Instead, the scope of the disclosure is defined by the appended claims rather than by the description, and all variations that fall within the range of the claims are intended to be embraced therein. Thus, other embodiments than the specific ones described above are equally possible within the scope of the appended claims.

The invention claimed is:

1. A display panel, comprising a first and second substrate which is arranged oppositely, wherein the first substrate comprises a black matrix layer and a first magnetic layer, the second substrate comprises a second magnetic layer which corresponds to the first magnetic layer in position, and the first and second magnetic layers form an attractive magnetic field force between the first and second substrates, a projection of the first magnetic layer and the second magnetic layer on the first substrate falls within a projection of the black matrix layer on the first substrate.

2. The display panel of claim 1, wherein the first and second magnetic layers have opposite polarities on their confronting surfaces.

3. The display panel of claim 2, wherein the first magnetic layer has N polarity on the surface facing the second magnetic layer, and the second magnetic layer has S polarity on the surface facing the first magnetic layer.

4. The display panel of claim 1, wherein the first magnetic layer is a top layer of the first substrate at a side facing the second substrate, and the second magnetic layer is a top layer of the second substrate at a side facing the first substrate.

5. The display panel of claim 1, wherein the first magnetic layer is a top layer of the first substrate at a side away from the second substrate, and the second magnetic layer is a top layer of the second substrate at a side facing the first substrate.

6. The display panel of claim 5, wherein the first and second magnetic layers have the same material.

7. The display panel of claim 1, wherein the first and second magnetic layers are thin films of a magnetic metal oxide.

8. The display panel of claim 1, wherein the display panel is a touch display panel.

9. A display device, comprising the display panel of claim 1.

10. A method for fabricating a display panel, comprising steps of:
forming a black matrix layer and a first magnetic layer on a first substrate;
forming a second magnetic layer which corresponds to the first magnetic layer in position on a second substrate, wherein the first and second magnetic layers form an attractive magnetic field force between the first and second substrates; and
arranging the first and second substrates oppositely,
wherein a projection of the first magnetic layer and the second magnetic layer on the first substrate falls within a projection of the black matrix layer on the first substrate.

11. The method of claim 10, wherein forming the first and second magnetic layers so that they have opposite polarities on their confronting surfaces.

12. The method of claim 10, wherein the step of forming the first magnetic layer comprises forming the first magnetic layer to have N polarity on the surface facing the second magnetic layer, and the step of forming the second magnetic layer comprises forming the second magnetic layer to have S polarity on the surface facing the first magnetic layer.

13. The method of claim 11, wherein the step of forming the first magnetic layer comprises forming the first magnetic layer as a top layer of the first substrate at a side facing the second substrate, and the step of forming the second magnetic layer comprises forming the second magnetic layer as a top layer of the second substrate at a side facing the first substrate.

14. The method of claim 11, wherein the step of forming the first magnetic layer comprises forming the first magnetic layer as a top layer of the first substrate at a side away from the second substrate, and the step of forming the second magnetic layer comprises forming the second magnetic layer as a top layer of the second substrate at a side facing the first substrate.

* * * * *